(12) United States Patent
Mostafazadeh et al.

(10) Patent No.: US 7,171,745 B2
(45) Date of Patent: Feb. 6, 2007

(54) APPARATUS AND METHOD FOR FORCE MOUNTING SEMICONDUCTOR PACKAGES TO PRINTED CIRCUIT BOARDS

(75) Inventors: Shahram Mostafazadeh, San Jose, CA (US); Joseph O. Smith, Morgan Hill, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 253 days.

(21) Appl. No.: 10/956,200

(22) Filed: Sep. 30, 2004

(65) Prior Publication Data

US 2005/0039330 A1 Feb. 24, 2005

Related U.S. Application Data

(62) Division of application No. 10/211,440, filed on Aug. 2, 2002, now Pat. No. 6,823,582.

(51) Int. Cl.
*H05K 3/30* (2006.01)
(52) U.S. Cl. .............................. 29/832; 29/833; 29/840
(58) Field of Classification Search ................. 29/832, 29/833, 840, 852
See application file for complete search history.

(56) References Cited

U.S. PATENT DOCUMENTS

| 419,466 | A | 1/1890 | McIntire et al. |
|---|---|---|---|
| 3,509,270 | A | 4/1970 | Yorgensen et al. |
| 3,816,847 | A | 6/1974 | Nagao |
| 4,055,761 | A | 10/1977 | Shimomura |
| RE31,114 | E | 12/1982 | Berg |
| 4,400,234 | A | 8/1983 | Berg |
| 4,410,223 | A | 10/1983 | Baker |
| 4,917,466 | A | 4/1990 | Nakamura et al. |
| 5,005,106 | A * | 4/1991 | Kiku .......................... 361/818 |
| 5,031,076 | A * | 7/1991 | Kiku .......................... 361/816 |
| 5,273,440 | A | 12/1993 | Ashman et al. |
| 5,306,948 | A | 4/1994 | Yamada et al. |
| 5,348,686 | A | 9/1994 | Vyas |
| 5,383,787 | A * | 1/1995 | Switky et al. ................. 439/67 |
| 5,396,403 | A | 3/1995 | Patel |
| 5,413,489 | A * | 5/1995 | Switky .......................... 439/71 |

(Continued)

OTHER PUBLICATIONS

"*Chip Scale Review Online*", downloaded from http://www.chipscalereview.com/issues/0900/techTrends.html, May 21, 2002.

*Primary Examiner*—Carl J. Arbes
(74) *Attorney, Agent, or Firm*—Beyer Weaver & Thomas, LLP

(57) ABSTRACT

An apparatus and method for force mounting semiconductor packages onto printed circuit boards without the use of solder. The apparatus includes a substrate, a first integrated circuit die mounted onto the substrate, a housing configured to house the first integrated circuit die mounted onto the substrate, and a force mechanism configured to force mount the housing including the integrated circuit die and substrate onto a printed circuit board. The method includes mounting a first integrated circuit die onto a first surface of a substrate, housing the first integrated circuit die mounted onto the substrate in a housing, and using a force mechanism to force mount the housing including the first integrated circuit die mounted on the substrate onto a printed circuit board. According to various embodiments, the force mechanism includes one of the following types of force mechanisms clamps, screws, bolts, adhesives, epoxy, or Instrument housings or heat stakes.

8 Claims, 4 Drawing Sheets

U.S. PATENT DOCUMENTS

| | | |
|---|---|---|
| 5,515,604 A | 5/1996 | Horine et al. |
| 5,764,409 A | 6/1998 | Colvin |
| 5,821,532 A | 10/1998 | Beaman et al. |
| 6,016,254 A | 1/2000 | Pfaff |
| 6,069,482 A | 5/2000 | Hilton |
| 6,078,500 A | 6/2000 | Beaman et al. |
| 6,081,429 A | 6/2000 | Barrett |
| 6,130,448 A | 10/2000 | Bauer et al. |
| 6,156,484 A | 12/2000 | Bassous et al. |
| 6,188,841 B1 | 2/2001 | Kamata |
| 6,204,455 B1 | 3/2001 | Gilleo et al. |
| 6,362,637 B2 | 3/2002 | Farnworth et al. |
| 6,390,826 B1 | 5/2002 | Affolter et al. |
| 6,393,116 B1 | 5/2002 | Kaiser et al. |
| 6,409,521 B1 | 6/2002 | Rathburn |
| 6,428,650 B1 | 8/2002 | Chung |
| 6,441,485 B1 | 8/2002 | Glenn |
| 6,476,625 B1 | 11/2002 | Do |
| 6,489,788 B2 | 12/2002 | Sausen |
| 6,501,658 B2 | 12/2002 | Pearson et al. |
| 6,506,978 B1 | 1/2003 | Furihata |
| 6,525,555 B1 | 2/2003 | Khandros et al. |
| 6,627,872 B1 | 9/2003 | Fukamura et al. |
| 6,629,363 B1 | 10/2003 | Chan |
| 6,646,289 B1 | 11/2003 | Badehi |
| 6,649,991 B1 | 11/2003 | Chen et al. |
| 6,686,667 B2 | 2/2004 | Chen et al. |
| 6,690,184 B1 | 2/2004 | Akram |
| 6,695,623 B2 | 2/2004 | Brodsky et al. |
| 6,823,582 B1 | 11/2004 | Mostafazadeh et al. |
| 2001/0000295 A1 | 4/2001 | Farnworth et al. |
| 2001/0040460 A1 | 11/2001 | Beaman et al. |
| 2002/0011859 A1 | 1/2002 | Smith et al. |
| 2002/0057468 A1 | 5/2002 | Segawa et al. |
| 2002/0060579 A1 | 5/2002 | Haseyama et al. |
| 2002/0070448 A1 | 6/2002 | Gonzalez et al. |
| 2002/0113958 A1 | 8/2002 | Wilsher et al. |
| 2002/0117330 A1 | 8/2002 | Eldridge et al. |
| 2002/0182900 A1 | 12/2002 | Brodsky et al. |
| 2003/0000739 A1 | 1/2003 | Frutschy et al. |
| 2003/0040139 A1 | 2/2003 | Canella |
| 2003/0042595 A1 | 3/2003 | Canella |
| 2003/0222333 A1 | 12/2003 | Bolken et al. |
| 2004/0048497 A1 | 3/2004 | Hougham |

\* cited by examiner

APPARATUS AND METHOD FOR FORCE MOUNTING SEMICONDUCTOR PACKAGES TO PRINTED CIRCUIT BOARDS

CROSS REFERENCE TO RELATED APPLICATIONS

This application is a Divisional of prior application Ser. No. 10/211,440, filed Aug. 2, 2002 now U.S. Pat. No. 6,823,582 from which priority under 35 U.S.C. §120 is claimed, and which is incorporated by reference herein for all purposes.

FIELD OF THE INVENTION

The present invention relates generally to semiconductor devices, and more particularly, to an apparatus and method for force mounting semiconductor packages to printed circuit boards.

BACKGROUND OF THE INVENTION

Imaging chips, such as CMOS sensors or CCDs, include circuitry which is capable of sensing images received by the chip. Imaging chips are typically encapsulated in a package that includes a lens of glass or some other type of transparent material that focuses an image onto the light sensitive circuitry of the chip. In response, the chip senses the actual image received by the imaging circuitry through the lens.

Imaging chips are usually affixed to a printed circuit board within some type of imaging system. Metal contacts between the chip and the board and metal traces on the board enable the imaging chip to communicate with other devices on the board.

A procedure known as "solder re-flow" is commonly used to affix most semiconductor devices onto printed circuit boards. During a standard solder re-flow operation, a solder paste is deposited onto contact pads of the chip package. Thereafter, the contacts are aligned and positioned onto mating contact pads of the printed circuit board. The package and board are then heated to temperatures sufficient to cause the solder paste to re-flow. When the heat is removed and the solder cools, bonds are formed at the contact points to affix the package to the board.

Solder re-flow operations are problematic with imaging chips. The high temperatures required to cause the solder to re-flow, typically 220 degrees C. or greater, may be harmful to the imaging circuitry on the chip. To overcome this problem, imaging chips are sometimes affixed to a printed circuit board using a laser to spot solder the contacts. With this procedure, a laser beam is focused specifically on the solder paste disposed between the contacts of the package and board. The heat from the laser causes the solder paste to re-flow. When the laser is removed, the solder cools, resulting in a bond between the package and the board. The advantage of spot welding is that the imaging circuitry is not exposed to elevated temperatures which helps prevent damage to the chip.

Spot welding of contacts, however, is less than ideal. Imaging chips tend to be highly integrated devices that require a high number of input/output contacts, typically arranged in an array located on the bottom surface of the chip package. It is therefore very difficult to spot solder the contacts located in the center region of the array away from the outer periphery of the chip package. Spot welding is also typically performed serially, one contact at a time. Thus the time involved to spot solder all the contacts of a chip is significant, particularly compared to a standard re-flow operation where all the contacts are re-flowed at the same time. The laser equipment is also expensive, which adds to the cost and complexity of printed circuit board assembly. Finally, once a chip is soldered to a printed circuit board, it is very difficult to remove without damaging the chip and/or board. It is therefore not feasible to either replace or upgrade in the field a chip package that has been soldered to a printed circuit board.

An apparatus and method for force mounting semiconductor packages onto printed circuit boards without the use of solder is therefore needed.

SUMMARY OF THE INVENTION

To achieve the foregoing, and in accordance with the purpose of the present invention, an apparatus and method for force mounting semiconductor packages onto printed circuit boards without the use of solder is described. The apparatus includes a substrate, a first integrated circuit die mounted onto the substrate, a housing configured to house the first integrated circuit die mounted onto the substrate, and a force mechanism configured to force mount the housing including the integrated circuit die and substrate onto a printed circuit board. The method includes mounting a first integrated circuit die onto a first surface of a substrate, housing the first integrated circuit die mounted onto the substrate in a housing, and using a force mechanism to force mount the housing including the first integrated circuit die mounted on the substrate onto a printed circuit board. According to various embodiments, the force mechanism may include one of the following clamps, screws, epoxy, adhesives, an Instrument housing, or heat stakes.

BRIEF DESCRIPTION OF THE DRAWINGS

The invention, together with further advantages thereof, may best be understood by reference to the following description taken in conjunction with the accompanying drawings in which.

In the Figures, like reference numbers refer to like components and elements.

DETAILED DESCRIPTION OF THE INVENTION

Figure 1:
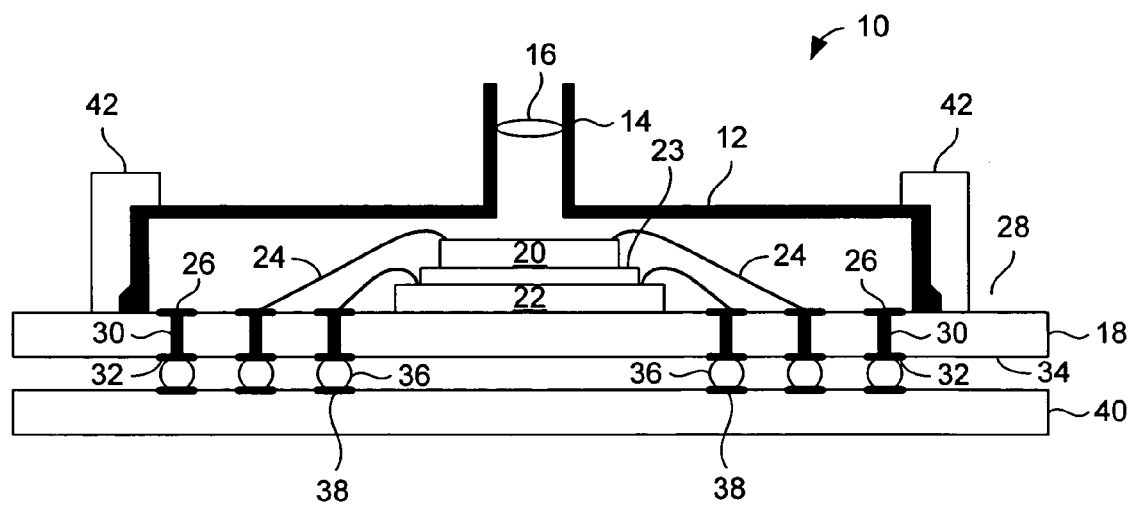
FIG. 1 cross section of the chip package affixed to a printed circuit board according to the present invention.

Referring to FIG. 1, a cross section of a chip package affixed to a printed circuit board according to the present invention is shown. The chip package 10 includes a housing 12 with a lens barrel 14, a lens 16 contained within the lens barrel 14, a substrate 18, a first integrated circuit die 20 and a second integrated circuit die 22. A non-conductive adhesive layer 23 is used to mount the first integrated circuit die 20 onto the second integrated circuit die 22. Wire bonds 24 are provided between the first and second integrated circuit dice 20 and 22 and a first set of contact pads 26 located on a first surface 28 of the substrate 18. Electrically conductive vias 30 are provided to electrically couple the first set of contact pads 26 with a second set of contact pads 32 located on a second surface 34 of the substrate 18. Contacts 36 are provided between the substrate 18 and a third set of contact pads 38 on the printed circuit board 40. A force mechanism 42 is used to force or pressure mount the housing 12 including the first and second integrated circuits 20 and 22 onto the printed circuit board 40.

According to one embodiment of the invention, the first integrated circuit die 20 is an imaging chip and second integrated circuit die 22 is an image processing chip. The housing 12 is made of an opaque material. Suitable opaque materials include, but are not limited to, plastic, metal, epoxy, or ceramic. The lens 16 can be either glass or some other transparent material such as plastic. The lens 16 is generally positioned within the lens barrel 14 such that images received through the lens barrel 14 are focused specifically onto the imaging circuitry of the first integrated circuit die 20. The substrate 18 can be made of any number of different types of materials, including for example, polyimide or flex-tape. The first integrated circuit die 20 includes imaging circuitry (not shown) that is capable of sensing images received through the lens 16 within the lens barrel 14. The second integrated circuit die 22 is configured to process the images sensed by the first integrated circuit die 20. In one embodiment, the contacts 36 are gold wire ball bonds. In other embodiments, the contacts 36 may be wire ball bonds made of other conductive metals such as copper, aluminum, etc. Finally, the force mechanism can be any one or a combination of a number of different type of mechanisms capable of applying a force sufficient to mount the housing 12 to the printed circuit board 40 such as screws, clamps, epoxy, adhesives, an Instrument housing, or heat stakes.

Figure 2:
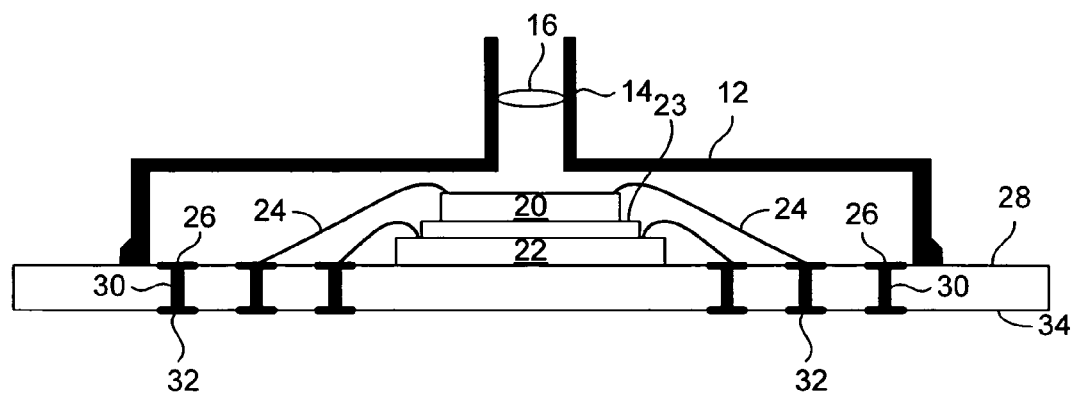
FIG. 2 is a cross section of the chip package of the present invention before it is affixed to a printed circuit board.

FIG. 2 is a cross section of the chip package 10 of the present invention before it is affixed to a printed circuit board. The package 10 is assembled using well known semiconductor packaging techniques to include the lens 16, the dice 20 and 22 mounted onto the substrate 18, and wire bonds 24 electrically connecting the dice 20 and 22 with the contact pads 26 on the substrate 18. As previously noted, the first integrated circuit 20 is mounted onto the second integrated circuit 22 using a non-conductive adhesive such as Ablestik epoxy 84-1. Similarly, the second integrated circuit die 22 is mounted onto substrate 18 using a similar non-conductive adhesive or an adhesive such as Ablestik 84-3.

Figure 3:
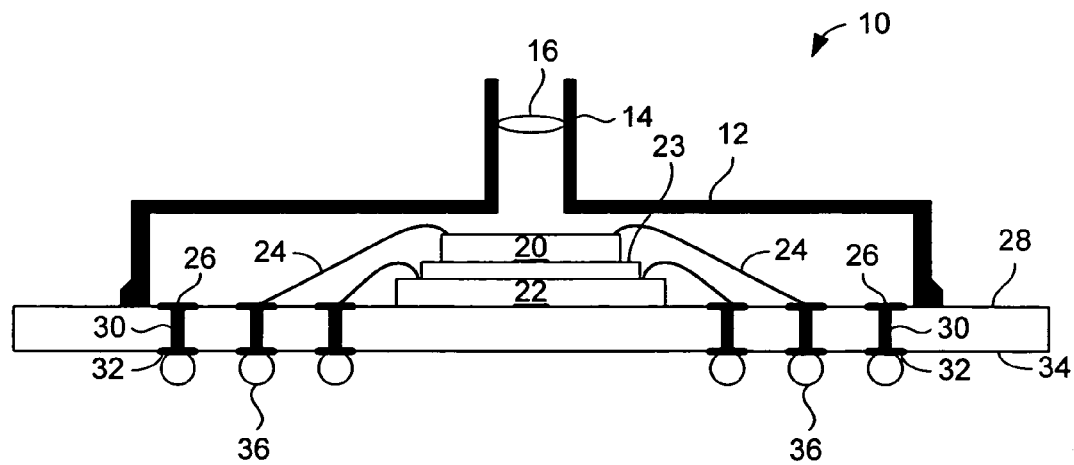
FIG. 3 is a cross section of the chip package with ball bonds used to affix the package to the printed circuit board according to the present invention.

FIG. 3 is a cross section of the chip package 10 after being prepared to be affixed to the printed circuit board according to the present invention. As is evident in the figure, the contacts 36 are formed on the contact pads 32 on the second surface 34 of the substrate 18. Specifically as illustrated in this embodiment, the contacts are formed from balls made of a conductive metal such as gold wire ball bonds. In alternative embodiments, the wire ball bonds are formed from other metals such as copper, aluminum, etc. During mounting, the housing 12 is positioned on the printed circuit board such that the contacts 36 are aligned with the contact pads 38 of the printed circuit board 40. Thereafter, the force mechanism 42 is employed to apply a mounting force so that the package 10 is affixed to the printed circuit board 40. It should be noted that solder balls have the advantage of being somewhat malleable or compliant so they compress under pressure as applied by the force mechanism 42. This helps maintain a good electrical contact between the contacts 36 and the contact pads 38.

Figure 4A:
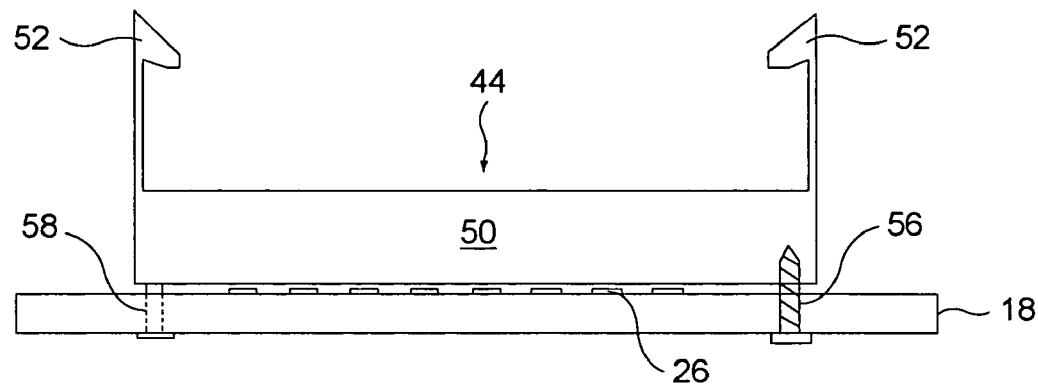
FIGS. 4A and 4B illustrate cross section of two embodiments of a clamp used to clamp the chip package to a substrate according to the present invention.
Figure 4B:
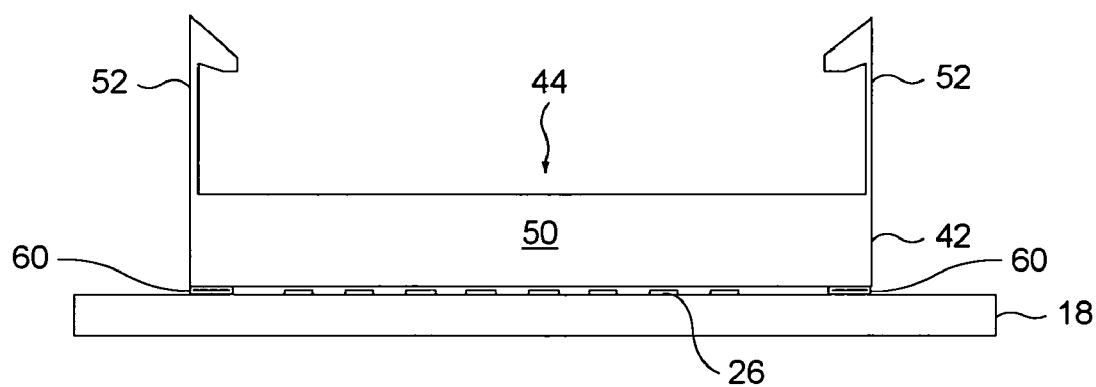

Referring to FIGS. 4A and 4B, one embodiment of the force mechanism 42 is shown. FIG. 4A shows a schematic side view of a clamp 44 mounted on a substrate 18 having contact pads 26 thereon. The clamp 44 includes a base portion 50 and first and second clamp arms 52 extending upward from the base 50. The arms 52 are flexible and resilient such that they will deform sideways and then return to a rest position as shown in FIG. 4A. The base 50 of clamp 44 includes a recess region (not shown) to accommodate the a chip package 10. When a package housing 12 is inserted into the recess region, the arms 52 deform sideways and then snap into place over the chip housing 12. In various embodiments, the clamp 44 may be mounted onto the substrate 18 using screws 56, heat stakes 58, or a combination thereof. The clamp 50 may be made of a plastic material or a metal. In FIG. 4B, the clamp 50 is attached to the substrate 18 using epoxy 60.

Figure 5A:
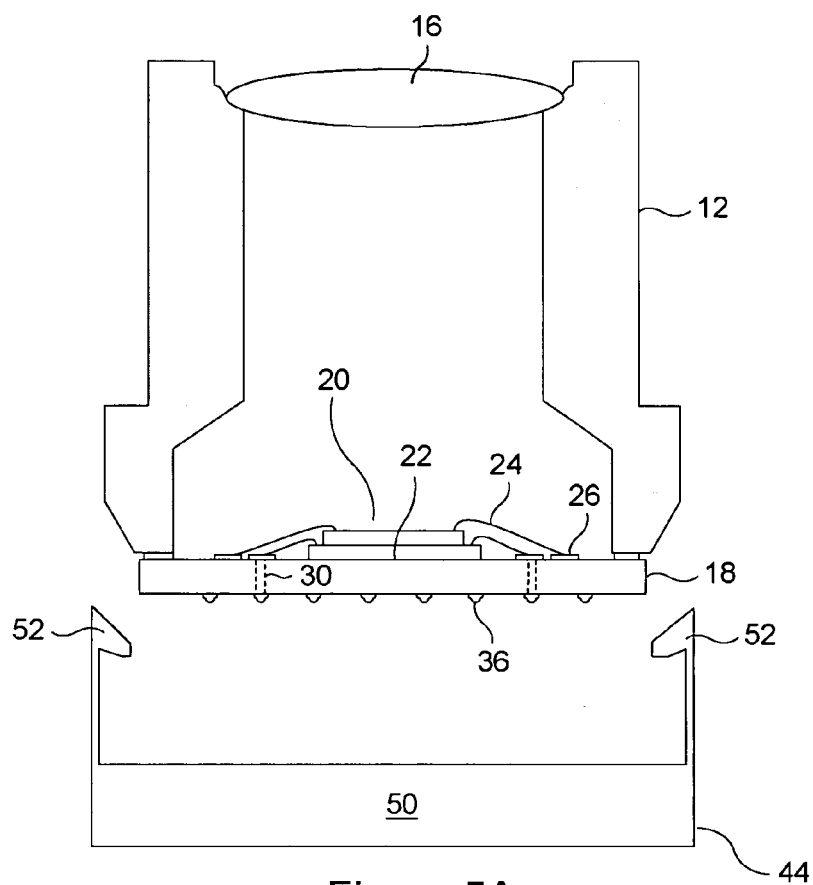
FIGS. 5A and 5B show various cross sections of a chip package 12 before and after being inserted into a clamp according to the present invention.
Figure 5B:
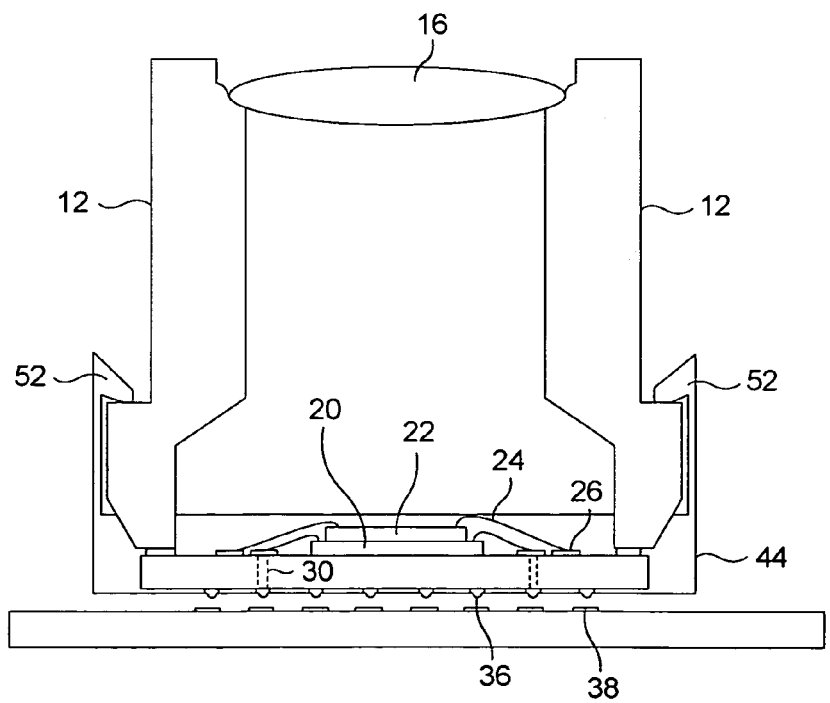

FIGS. 5A and 5B show various cross sections of a chip housing 12 before and after being inserted into a clamp 44 according to various embodiments of the invention. As is seen in FIG. 5A, the chip housing 12 is positioned over and inserted into the recess region of the clamp 44. In FIG. 5B, the chip housing 12 is shown inserted into the clamp 44. The arms 52 of the clamp 44 snap fit over the chip package 12 to hold it in place within the clamp. Although not illustrated in FIG. 5B, the clamp 42 may then be fastened to a printed circuit board 40 using screws, epoxy, heat stakes, an adhesive, etc.

Figure 6:
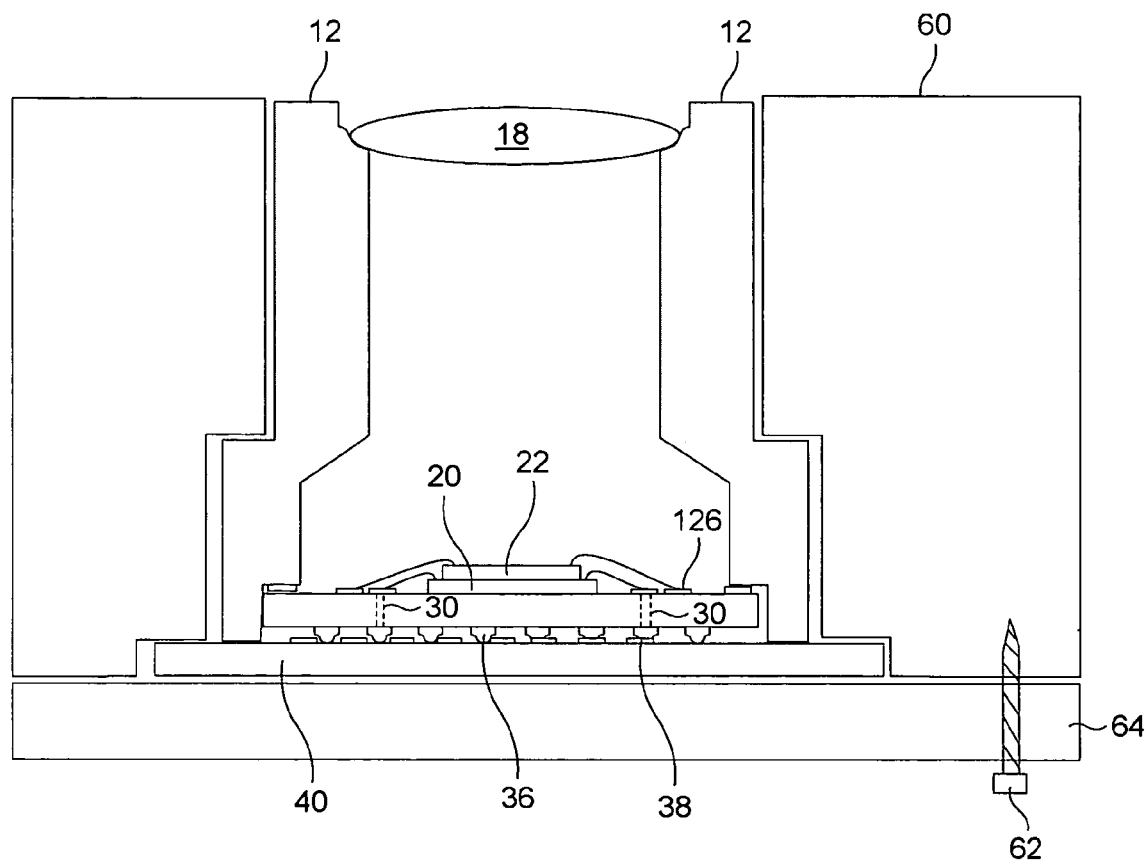
FIG. 6 is another embodiment of the present invention.

Referring to FIG. 6, yet another embodiment of the invention is shown. In this embodiment, an Instrument housing 60 is used to pressure mount the chip package 12. As is illustrated in the Figure, a screw 62 is used to affix a bottom case 64 to the Instrument housing 60. In alternative embodiments, epoxy, snap features, or heat stakes could be used.

One useful benefit of the present invention is that the force mechanism can be readily released, thus separating the package 10 from the printed circuit board 40. This feature is particularly useful for products that are already in the field. It allows a integrated circuit(s) housed within a package 10 to be readily removed in the field in the event of a product failure or a product upgrade.

Although the foregoing invention has been described in some detail for purposes of clarity of understanding, it will be apparent that certain changes and modifications may be practiced within the scope of the appended claims. For example, although the present invention was described using an imaging chip and a video processing chip, it should be understood that the present invention may be used with any type or number of chips. Further, in cases where multiple chips are used, they do not necessarily have to be stacked one on top of the other. Rather they can be mounted side-by-side on the substrate 18 for example. Therefore, the described embodiments should be taken as illustrative and not restrictive, and the invention should not be limited to the details given herein but should be defined by the following claims and their full scope of equivalents.

We claim:
1. A method comprising:
  mounting a first integrated circuit die onto a first surface of a substrate;
  housing the first integrated circuit die mounted onto the substrate in a housing;

using a force mechanism to force mount the housing including the first integrated circuit die mounted on the substrate onto a printed circuit boards; and a first set of contact pads on the first surface of the substrate, a second set of contact pads on a second surface of the substrate, and vias through the substrate to electrically couple the first set of contact pads and the second set of contact pads respectively.

2. The method of claim 1, wherein the force mechanism includes one of the following types of force mechanisms: clamps, screws, epoxy, adhesives, or Instrument housings, or heat stakes.

3. The method of claim 1, further comprising forming contacts on the substrate, the contacts being configured to provide electrical contacts between the substrate and the printed circuit board when the housing is force mounted onto the printed circuit board.

4. The method of claim 3, wherein the method of forming contacts further comprising forming wire ball bonds onto the substrate.

5. The method of claim 1, further comprising electrically coupling the first integrated circuit die to the first set of contacts on the first surface of the substrate.

6. The method of claim 1, further comprising mounting a second integrated circuit die onto the substrate.

7. The method of claim 6, wherein the second integrated circuit is mounted onto the first integrated circuit die within the housing.

8. The method of claim 7, wherein the second integrated circuit die is an imaging sensing chip and the first integrated circuit die is imaging processing chip.

* * * * *